United States Patent
McLeod et al.

(10) Patent No.: US 9,034,157 B2
(45) Date of Patent: *May 19, 2015

(54) FORMING ORIENTED FILM FOR MAGNETIC RECORDING MATERIAL

(75) Inventors: Paul S. McLeod, Berkeley, CA (US); Charles F. Brucker, Pleasanton, CA (US); Jeffrey S. Reiter, Palo Alto, CA (US)

(73) Assignee: Seagate Technology LLC, Curpertino, CA (US)

(*) Notice: Subject to any disclaimer, the term of this patent is extended or adjusted under 35 U.S.C. 154(b) by 18 days.

This patent is subject to a terminal disclaimer.

(21) Appl. No.: 13/618,633

(22) Filed: Sep. 14, 2012

(65) Prior Publication Data
US 2013/0011575 A1    Jan. 10, 2013

Related U.S. Application Data

(63) Continuation of application No. 11/142,478, filed on Jun. 2, 2005, now Pat. No. 8,591,710.

(51) Int. Cl.
| | |
|---|---|
| C23C 14/34 | (2006.01) |
| C23C 14/56 | (2006.01) |
| G11B 5/85 | (2006.01) |
| G11B 5/852 | (2006.01) |
| G11B 5/65 | (2006.01) |
| G11B 5/667 | (2006.01) |

(52) U.S. Cl.
CPC ............... *C23C 14/568* (2013.01); *G11B 5/656* (2013.01); *G11B 5/667* (2013.01); *G11B 5/85* (2013.01); *G11B 5/852* (2013.01)

(58) Field of Classification Search
USPC .............................. 204/298.25; 118/719, 729
See application file for complete search history.

(56) References Cited

U.S. PATENT DOCUMENTS

| | | | | |
|---|---|---|---|---|
| 4,911,815 | A * | 3/1990 | Kamei et al. ............. | 204/298.25 |
| 5,213,349 | A * | 5/1993 | Elliott ........................... | 279/128 |
| 8,208,238 | B1 * | 6/2012 | Mcleod et al. ................ | 361/143 |
| 2004/0265570 | A1 * | 12/2004 | Takahashi et al. ............ | 428/328 |
| 2005/0136290 | A1 * | 6/2005 | Brucker et al. ........ | 428/694 TM |

* cited by examiner

*Primary Examiner* — Jason M Berman
(74) *Attorney, Agent, or Firm* — Hall Estill Attorneys at Law

(57) ABSTRACT

An apparatus and associated method for reorienting the magnetic anisotropy of magnetic recording discs. A pallet that is moveable along a path of travel is also sized to selectively hold either a first magnetic recording disc of a first size or a second magnetic recording disc of a second size different than the first size. A first processing chamber in the path of travel is adapted for forming a soft underlayer (SUL) of magnetic material with non-radially oriented magnetic anisotropy on a substrate corresponding to one of the first and second magnetic recording discs. A second processing chamber in the path of travel downstream of the first processing chamber is adapted for selectively re-orienting the SUL's magnetic anisotropy via a magnetic source emanating a first magnetic field if the substrate corresponds to the first magnetic recording disc and emanating a different second magnetic field if the substrate corresponds to the second magnetic recording disc.

16 Claims, 5 Drawing Sheets

FORMING ORIENTED FILM FOR MAGNETIC RECORDING MATERIAL

RELATED APPLICATION

This is a continuation application of U.S. patent application Ser. No. 11/142,478 (publication number 2006/0272937) claiming benefit to its earlier filing date and incorporating its disclosure in its entirety herein.

FIELD OF THE DISCLOSURE

The present disclosure relates to a method and apparatus for forming magnetic films with a desired orientation of magnetic anisotropy. The disclosed method and apparatus have particular utility in the manufacture of high areal recording density perpendicular magnetic recording media, e.g., hard disk perpendicular media utilizing soft magnetic underlayers for enhanced read/write characteristics.

BACKGROUND DISCUSSION

Magnetic media are widely used in various applications, particularly in the computer industry, and efforts are continually made with the aim of increasing the areal recording density, i.e., bit density of the magnetic media. Conventional thin-film type magnetic recording media, wherein a fine-grained polycrystalline magnetic alloy serves as the active recording layer, are generally classified as "longitudinal" or "perpendicular", depending upon the orientation of the magnetic domains of magnetic material. In perpendicular magnetic recording media, residual magnetization is formed in a direction perpendicular to the surface of the magnetic medium, typically a layer of a magnetic material on a suitable substrate. Very high linear recording densities are obtainable by utilizing a "single-pole" magnetic transducer or "head" with such perpendicular magnetic media.

It is well-known that efficient, high bit density recording utilizing a perpendicular magnetic medium requires interposition of a relatively thick (i.e., as compared to the magnetic recording layer), magnetically "soft" underlayer (SUL) or "keeper" layer, i.e., a magnetic layer having a relatively low coercivity below about 1 kOe, between a non-magnetic substrate and a "hard" magnetic recording layer having perpendicular anisotropy K and a relatively high coercivity $H_c$ of several kOe, typically about 3-6 kOe. The magnetically soft underlayer (SUL) e.g., of a NiFe alloy such as Permalloy serves to guide magnetic flux emanating from the head through the hard, perpendicular magnetic recording layer, typically comprised of a Co-based alloy material, such as CoCr. In addition, the magnetically soft underlayer (SUL) reduces susceptibility of the medium to thermally-activated magnetization reversal by reducing the demagnetizing fields which lower the energy barrier that maintains the current state of magnetization.

Referring to FIG. 1, a typical conventional perpendicular recording system 10 comprises a vertically oriented (i.e., perpendicular) magnetic medium 1 and a single-pole head 2. Medium 1 includes substrate 3, relatively thick soft magnetic underlayer (SUL) 4, at least one relatively thin non-magnetic (i.e., non-ferromagnetic) interlayer 5 (sometimes referred to as an "intermediate" layer), at least one relatively thin magnetically hard recording layer 6, and a thin protective overcoat layer 7. Interlayer 5 serves to: (1) prevent magnetic interaction between the SUL 4 and the recording layer 6 and (2) promote desired microstructural and magnetic properties of the magnetically hard recording layer 6.

As illustrated in FIG. 1, single-pole head 2 includes a main pole 8 and an auxiliary pole 9. As shown by the arrows in the figure indicating the path of the magnetic flux $\Phi$, flux $\Phi$ is seen as emanating from main pole 8 of single-pole magnetic transducer head 2, entering and passing through vertically oriented, hard magnetic recording layer 6 in the region below main pole 8, entering and traveling along SUL 4 for a distance, and then exiting therefrom and passing through the perpendicular hard magnetic recording layer 6 in the region below auxiliary pole 9 of single-pole magnetic transducer head 2. The direction of movement of perpendicular magnetic medium 1 past transducer head 6 in the x-direction is indicated in the figure by the arrow above medium 1.

Perpendicular magnetic recording systems such as system 10 comprising perpendicular recording medium 1 include SUL 4 in order to channel the magnetic field from the main pole 8 of the single-pole head 2 and thereby increase the effective magnetic field applied to the magnetically hard recording layer 6. The increased magnetic field enables an increase in the media coercivity $H_c$ which can be utilized, ultimately resulting in improvements in the media signal-to-noise ratio (SNR), thermal stability, and areal recording density.

With continued reference to FIG. 1, substrate 3 is typically disk-shaped and comprised of a non-magnetic metal or alloy, e.g., an Al-based alloy, such as Al—Mg having an Ni—P plating layer on the deposition surface thereof, or substrate 3 is comprised of a suitable glass, ceramic, glass-ceramic, polymeric material, or a composite or laminate of these materials. The relatively thick SUL 4 is typically comprised of an about 40-400 nm layer of a soft magnetic material selected from the group consisting of Ni, NiFe (Permalloy), Co, CoZr, CoZrCr, CoZrNb, CoFe, Fe, FeN, FeSiAl, FeSiAlN, FeCoC, FeCoB, etc. Relatively thin interlayer 5 typically comprises an up to about 30 nm thick layer of a non-magnetic material, such as TiCr. Magnetically hard recording layer 6 is typically comprised of an about 10 to about 25 nm thick layer of a Co-based alloy including one or more elements selected from the group consisting of Cr, Fe, Ta, Ni, Mo, Pt, V, Nb, Ge, B, and Pd, iron nitrides or oxides, or a (CoX/Pd or Pt)$_n$ multilayer magnetic superlattice structure, where n is an integer from about 10 to about 25, each of the alternating, thin layers of Co-based magnetic alloy is from about 2 to about 3.5 .ANG. thick, X is an element selected from the group consisting of Cr, Ta, B, Mo, Pt, W, and Fe, and each of the alternating thin, non-magnetic layers of Pd or Pt is up to about 10 .ANG. thick. Each type of hard magnetic recording layer material has perpendicular anisotropy arising from magneto-crystalline anisotropy ($1^{st}$ type) and/or interfacial anisotropy ($2^{nd}$ type).

Completing medium 1 is a protective overcoat layer 7, such as a layer of a diamond-like carbon (DLC) formed over magnetic recording layer 6, and a lubricant topcoat layer (not shown in the figure for illustrative simplicity), e.g., a layer of a perfloropolyether material, formed over the protective overcoat layer 7.

As indicated above, a conventionally-configured perpendicular magnetic recording medium such as illustrated in FIG. 1 typically comprises a relatively thick SUL 4 of a high magnetization ($M_s$) material (such as those enumerated supra) which exhibits in-plane anisotropy dominated by shape anisotropy $4\pi M_s$. The magnetic structure of the SUL 4 can contribute to degradation of media performance, at least for the following reason. Magnetic domain walls in the soft magnetic materials, whether such materials are present in the media as a SUL or in read/write transducer head(s), must be carefully controlled in order to avoid spurious system behavior. For example, the fringe magnetic field from a domain wall in the SUL can produce a large signal when it passes by the read head. This phenomenon, in itself, is undesirable because it interferes with signal detection from the recording layer of the media. If, in addition, the domain wall is mobile and its position is largely random at any given instant, unpredictable noise can be generated which significantly exacerbates the problem.

Magnetic anisotropy in the SUL is a key property affecting magnetic domain formation and structure. Magnetic anisotropy in soft magnetic materials is generally not intrinsic, but rather it can be controllably engineered by several means, including field-induced pair-ordering, deposition geometry, induced-shape anisotropy, and/or stress-induced magnetoelastic anisotropy. Techniques and materials have been developed to control SUL magnetic anisotropy such that no domain walls exist in the SUL layer of disk-shaped media, thus avoiding the above-mentioned problems. Radial and circumferential anisotropy distributions can be fabricated as to be domain-free (i.e., the SUL magnetic easy axis is or can be oriented in either the radial or circumferential direction). In practice, however, radial anisotropy of the SUL is most often employed in the manufacture of disk-shaped media since it occurs naturally when the SUL is deposited utilizing circular planar magnetron sputter deposition cathodes/targets in static, single-disk sputter deposition apparatus.

Regarding sputter deposition of magnetic materials, such as SUL materials, on disk-shaped substrates utilizing circular planar magnetron cathodes/targets (or any other type of vapor deposition source), it is noted that oblique vapor deposition of magnetic materials produces films with columnar grains that are magnetically oriented towards the vapor source. For disk-shaped perpendicular media, the orientation is radial, i.e., towards the center of the disk. When media are fabricated utilizing a static, single-disk sputter deposition apparatus with a circular-shaped planar magnetron cathode/target of a larger diameter than the outer diameter of the disk, the residual anisotropy is fortuitously predominantly radially oriented because most of the sputtered particle flux that arrives at the disk surface originates from the circular ("racetrack")-shaped erosion region of the cathode/target surface located outside of the outer diameter of the disk.

By contrast, the conditions for obtainment of such radially oriented anisotropy of sputter-deposited magnetic layers on disk-shaped substrates are considerably less fortuitous when the media are fabricated in pass-by sputter deposition systems where the incident angle of the sputtered particle flux continuously changes as the disk travels through the deposition chamber and the resultant magnetic layer(s) has (have) little radial anisotropy. More specifically, when disk-shaped media are fabricated in batches (i.e., where a plurality of disks are mounted on a pallet and processed simultaneously) by means of pass-by sputter deposition systems, due to the pass-by motion and shape of the magnetron cathodes, the symmetry of the incident sputtered particle fluxes, as well as the symmetry of the magnetic field acting on the depositing SUL, are no longer radial. In fact, for elongated rectangular cathodes/targets typically used in pallet pass-by sputter tools, linear rather than radial anisotropy is typically induced, resulting in the formation of undesirable closure domains in the SUL.

In view of the foregoing, there exists a clear need for improved means and methodology for forming magnetic layers, particularly SUL films for disk-shaped perpendicular magnetic recording media, with substantially radially oriented magnetic anisotropy, utilizing cost-effective pass-by manufacturing technology and systems. Further, there exists a clear need for improved, disk-shaped perpendicular magnetic recording media which can be economically and cost-effectively fabricated utilizing pass-by manufacturing technology and systems.

SUMMARY OF THE DISCLOSURE

Embodiments of the present invention contemplate an apparatus for reorienting the magnetic anisotropy of magnetic recording discs. The apparatus includes a pallet that is moveable along a path of travel and that is sized to selectively hold either a first magnetic recording disc of a first size or a second magnetic recording disc of a second size different than the first size. The apparatus has a first processing chamber in the path of travel adapted for forming a soft underlayer (SUL) of magnetic material with non-radially oriented magnetic anisotropy on a substrate corresponding to one of the first and second magnetic recording discs. The apparatus also has a second processing chamber in the path of travel downstream of the first processing chamber adapted for selectively re-orienting the SUL's magnetic anisotropy via a magnetic source emanating a first magnetic field if the substrate corresponds to the first magnetic recording disc and emanating a different second magnetic field if the substrate corresponds to the second magnetic recording disc.

Embodiments of the present invention contemplate an apparatus for reorienting the magnetic anisotropy of magnetic recording discs. The apparatus includes a pallet that is moveable along a path of travel and that is sized to selectively hold a plurality of magnetic recording discs. A first processing chamber in the path of travel is adapted for forming soft underlayers (SULs) of magnetic material with non-radially oriented magnetic anisotropy on each of a plurality of substrates corresponding to the magnetic recording discs. A second processing chamber in the path of travel downstream of the first processing chamber is adapted for selectively re-orienting each SUL's magnetic anisotropy via a magnetic source defining magnetic centers individually for each of the SULs and emanating magnetic fields radially from each magnetic center.

Embodiments of the present invention contemplate a method for reorienting the magnetic anisotropy of magnetic recording discs, including: placing a plurality of substrates on a pallet; after the placing, moving the pallet through a first processing chamber to form soft underlayers (SULs) of magnetic material with non-radially oriented magnetic anisotropy on each substrate; and after the moving through the first processing chamber, moving the pallet through a second processing chamber to re-orient each SUL's magnetic anisotropy via a magnetic source defining magnetic centers individually for each of the SULs and emanating magnetic fields radially from each magnetic center.

An advantage of the present disclosure is an improved method of forming a layer of a magnetic material with radially oriented magnetic anisotropy.

A further advantage of the present disclosure is an improved method of fabricating a magnetic recording medium including a layer of a magnetic material with radially oriented magnetic anisotropy.

Yet another advantage of the present disclosure is an improved method of fabricating a magnetic recording medium including a soft underlayer (SUL) of a magnetic material with radially oriented magnetic anisotropy.

A still further advantage of the present disclosure is an improved method of fabricating a perpendicular magnetic recording medium including a soft underlayer (SUL) of a magnetic material with radially oriented magnetic anisotropy.

Another advantage of the present disclosure is an improved apparatus forming a layer of a magnetic material with radially oriented magnetic anisotropy.

A further advantage of the present disclosure is an improved apparatus for fabricating a magnetic recording medium including a layer of a magnetic material with radially oriented magnetic anisotropy.

Additional advantages and other features of the present disclosure will be set forth in the description which follows and in part will become apparent to those having ordinary skill in the art upon examination of the following or may be learned from the practice of the present disclosure. The advantages of the present disclosure may be realized and obtained as particularly pointed out in the appended claims.

According to an aspect of the present disclosure, the foregoing and other advantages are obtained in part by a method of forming a layer of a magnetic material with radially oriented magnetic anisotropy, comprising sequential steps of:

(a) providing a circular, annular disk-shaped substrate having an inner diameter and an outer diameter;

(b) forming a layer of a magnetic material with non-radially oriented magnetic anisotropy over at least one surface of the substrate; and (c) re-orienting the non-radially oriented magnetic anisotropy in a radial direction.

According to embodiments of the disclosure, step (b) comprises forming the layer of magnetic material with non-radially oriented magnetic anisotropy by means of a vapor deposition process, preferably in a pass-by vapor deposition apparatus, more preferably in a pass-by cathode sputtering apparatus, e.g., comprising at least one processing chamber with at least one elongated rectangular planar magnetron sputtering target/cathode therein, mounting means for carrying at least one disk-shaped substrate, and transport means for transporting the mounting means through the at least one processing chamber past the at least one elongated rectangular planar magnetron sputtering target/cathode.

Preferably, step (c) comprises magnetically re-orienting the magnetic anisotropy in a radial direction, and comprises applying a substantially uniform magnetic field over a surface of the layer of magnetic material, the applied magnetic field extending from the inner diameter to the outer diameter of the disk and being of strength and duration sufficient to re-orient the non-radially oriented magnetic anisotropy of the layer of magnetic material in the radial direction.

According to a preferred embodiment of the present disclosure, step (c) comprises applying the substantially uniform magnetic field utilizing at least one substantially flat permanent magnet or electromagnet in parallel spaced adjacency to the surface of the layer of magnetic material.

Preferably, step (c) comprises performing a preliminary step ($c_1$) of heating the disk-shaped substrate prior to performing a step ($c_2$) of re-orienting the non-radially oriented magnetic anisotropy in the radial direction. Preferably, step ($c_2$) further comprises cooling the disk-shaped substrate during and subsequent to the re-orienting of the non-radially oriented magnetic anisotropy in the radial direction, and step (b) and steps ($c_1$) and ($c_2$) are each performed in a separate chamber of a multi-chamber processing apparatus.

Embodiments of the present disclosure include those wherein step (b) comprises forming a layer of a soft magnetic material selected from the group consisting of Ni, NiFe (Permalloy), Co, CoZr, CoZrCr, CoZrNb, CoFe, Fe, FeN, FeSiAl, FeSiAlN, FeCoC, and FeCoB; and step (c) comprises forming a radially oriented magnetically soft underlayer (SUL) of a magnetic recording medium.

Another aspect of the present disclosure is a method for forming a magnetic recording medium, comprising the above-described steps (a)-(c) and a further step of:

(d) forming a layer stack including at least one magnetically hard recording layer, preferably at least one magnetically hard perpendicular recording layer comprised of a material selected from the group consisting of: Co-based alloys including one or more elements selected from the group consisting of Cr, Fe, Ta, Ni, Mo, Pt, V, Nb, Ge, B, and Pd, iron nitrides, iron oxides, and $(CoX/Pd$ or $Pt)_n$ multilayer magnetic superlattice structures, where n is an integer from about 10 to about 25, and X is an element selected from the group consisting of Cr, Ta, B, Mo, Pt, W, and Fe.

Still another aspect of the present disclosure is a multi-chamber treatment/processing apparatus, comprising:

(a) at least first and second serially arranged treatment/processing chambers, each including inlet and outlet means for insertion and withdrawal of at least one disk-shaped substrate from the respective interior spaces thereof; and (b) transport means for transporting the at least one substrate through the interior spaces for treatment/processing therein; wherein:

the first chamber is adapted for forming a layer of a magnetic material with non-radially oriented magnetic anisotropy over at least one surface of the at least one substrate; and the second chamber is adapted for re-orienting the non-radially oriented magnetic anisotropy to form a layer of magnetic material with magnetic anisotropy oriented in a radial direction.

According to embodiments of the present disclosure, the first chamber is adapted to perform a pass-by vapor deposition process for forming the layer of magnetic material, preferably a pass-by sputter deposition process for forming the layer of magnetic material, and includes at least one elongated rectangular planar magnetron sputtering target/cathode; the second chamber comprises at least one magnet means adapted for magnetically re-orienting the non-radially oriented magnetic anisotropy in a radial direction, the second chamber being adapted for applying a substantially uniform magnetic field over a surface of the layer of magnetic material, the applied magnetic field extending from the inner diameter to the outer diameter of the disk and being of strength and intensity sufficient to re-orient the non-radially oriented magnetic anisotropy of the layer of magnetic material in the radial direction.

Preferably, the second chamber is adapted for applying the substantially uniform magnetic field from at least one substantially flat permanent or electromagnet in parallel spaced adjacency to the surface of the layer of magnetic material.

According to an embodiment of the disclosure, the second chamber comprises first and second sub-chambers, the first sub-chamber located before the second sub-chamber in the path of transport of the at least one substrate from the first chamber to the second chamber and including heating means for elevating the temperature of the at least one substrate with the layer of magnetic material with non-radially oriented magnetic anisotropy thereon, and the second sub-chamber comprises the at least one magnet means adapted for magnetically re-orienting the non-radially oriented magnetic anisotropy in a radial direction and further includes cooling means for cooling the at least one substrate with the magnetically re-oriented magnetic layer thereon.

Embodiments of the disclosure include those wherein the transport means comprises pallet means for transporting a plurality of circular, annular disk-shaped substrates through the interior spaces of the chambers for treatment/processing therein; and wherein the apparatus further comprises:

(d) at least one subsequent treatment/processing chamber located after the second treatment/processing chamber in the path of transport of the at least one substrate through the apparatus.

Preferably, the first treatment/processing chamber is adapted for forming a soft magnetic underlayer (SUL) for a magnetic recording medium; and the at least one subsequent treatment/processing chamber is adapted for forming at least one magnetically hard recording layer on the magnetically re-oriented layer.

Additional advantages and aspects of the present disclosure will become readily apparent to those skilled in the art from the following detailed description, wherein embodiments of the present disclosure are shown and described, simply by way of illustration of the best mode contemplated for practicing the present disclosure. As will be described, the present disclosure is capable of other and different embodiments, and its several details are capable of modification in various obvious respects, all without departing from the spirit of the present disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the various features are not necessarily drawn to scale but rather are drawn as to best illustrate the pertinent features, wherein.

DETAILED DESCRIPTION OF THE EMBODIMENTS

Figure 1:
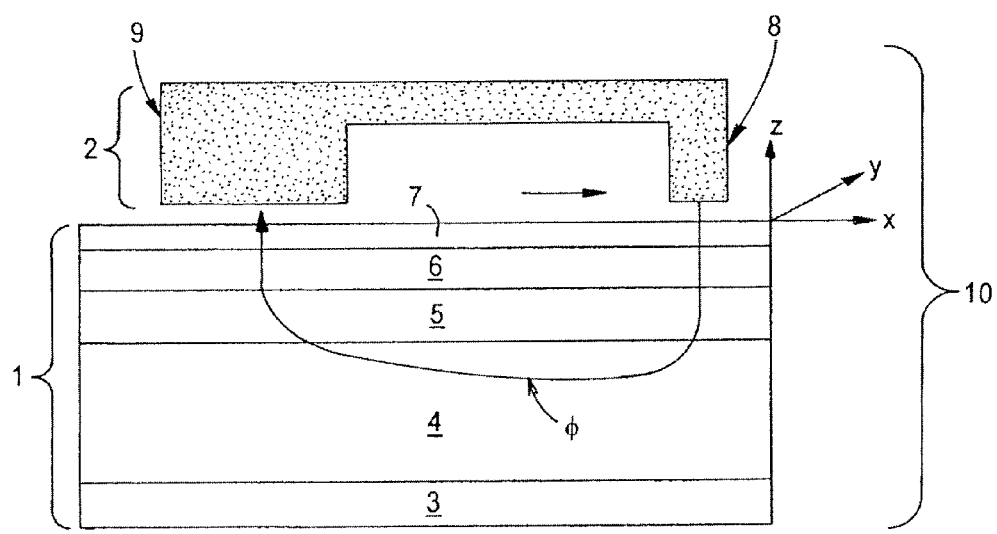
FIG. 1 schematically illustrates, in simplified cross-sectional view, a portion of a magnetic recording, storage, and retrieval system comprised of a single-pole magnetic transducer head and a perpendicular type magnetic recording medium including a soft magnetic underlayer (SUL), a non-magnetic interlayer, and a perpendicular hard magnetic recording layer.

The present disclosure addresses and solves problems, disadvantages, and drawbacks associated with the fabrication of certain types of magnetic recording media, e.g., high areal density perpendicular media, when high product throughput manufacturing technology, e.g., pass-by deposition methodology, is utilized for depositing one or more component layers (e.g., the requisite soft magnetic underlayer, i.e., SUL) of the media on disk-shaped substrates. More specifically, the present disclosure is based upon recognition by the instant inventors that the conditions for obtainment of desired magnetic layers on disk-shaped media substrates, e.g., magnetron sputter-deposited layers with radially oriented anisotropy, are considerably less fortuitous when the media are fabricated in pass-by sputter deposition systems than in static deposition systems. The inventors have determined that formation of magnetic layers with non-radial anisotropy occurs when the incident angle of the sputtered particle flux continuously changes as the disk travels through the pass-by deposition chamber. In particular, when such disk-shaped media are fabricated in batches (i.e., where a plurality of disks are mounted on a pallet and processed simultaneously) by means of pass-by sputter deposition systems, due to the pass-by motion and shape of the elongated linear magnetron cathodes, the symmetry of the incident sputtered particle fluxes, as well as the symmetry of the magnetic field acting on the depositing SUL, are no longer radial. In fact, for elongated rectangular cathodes/targets typically used in pallet pass-by sputter tools, linear rather than radial anisotropy is typically induced, resulting in the formation of undesirable closure domains in the SUL.

According to the present disclosure, a layer of a magnetic material (typically a SUL for a perpendicular recording medium) with non-radially oriented magnetic anisotropy is first formed over at least one surface of a circular disk-shaped substrate having an inner diameter and an outer diameter and the as-deposited substrate is then subjected to processing for re-orienting the non-radially oriented magnetic anisotropy in a radial direction. The layer of magnetic material with non-radially oriented magnetic anisotropy is typically formed on the disk-shaped substrate by means of a vapor deposition process, preferably in a pass-by vapor deposition apparatus, more preferably in a pass-by cathode sputtering apparatus comprising at least one processing chamber with at least one elongated rectangular planar magnetron sputtering target/cathode therein, mounting means for carrying at least one annular disk-shaped substrate, and transport means for transporting the mounting means through the at least one processing chamber past the at least one elongated rectangular planar magnetron sputtering target/cathode.

Re-orienting of the magnetic anisotropy of the magnetic film in a radial direction typically comprises applying a substantially uniform magnetic field over a surface of the as-deposited layer of magnetic material. The applied magnetic field extends from the inner diameter to the outer diameter of the annular disk, and is of sufficient strength and duration to effect re-orientation of the non-radially oriented magnetic anisotropy of the as-deposited layer of magnetic material in the radial direction within a selected interval. For example, for typical media substrates having inner diameters from about 6 mm to about 25.4 mm and outer diameters from about 21.6 mm to about 95 mm, respectively, and with an about 40-400 nm thick pass-by sputter-deposited SUL comprised of a soft magnetic material such as Ni, NiFe (Permalloy), Co, CoZr, CoZrCr, CoZrNb, CoFe, Fe, FeN, FeSiAl, FeSiAlN, FeCoC, FeCoB, etc., the applied tangential magnetic field strength $B_T$ may range from about 200 to about 450 Gauss (as measured at a distance of about 0.4 in. from the disk surface) for an interval sufficient to effect magnetic re-orientation, e.g., about 1-2 sec. for a SUL comprised of FeCoB.

According to an embodiment of the present disclosure, the substantially uniform magnetic field is applied to the as-deposited magnetic film utilizing at least one substantially flat permanent magnet or electromagnet in parallel spaced adjacency to the surface of the layer of magnetic material. Preferably, the magnetic field is applied utilizing a plurality of magnets and the disk-shaped substrate with magnetic layer formed thereon is heated prior to re-orienting the as-deposited non-radially oriented magnetic anisotropy in the radial direction. In addition, the disk-shaped substrate with magnetic layer thereon is preferably cooled during and subsequent to the magnetic re-orienting process. Each of these steps is preferably performed in a separate chamber of a multi-chamber processing apparatus, e.g., of in-line or circular configuration.

Typically, as in the manufacture of high areal recording density perpendicular media, the disk-shaped media substrate initially provided to the processing apparatus is comprised of a material selected from the group consisting of: Al, NiP-plated Al, Al—Mg alloys, other Al-based alloys, other non-magnetic metals, other non-magnetic alloys, glass, ceramics, glass-ceramics, polymeric materials, and composites and/or laminate of these materials, the magnetic layer deposited thereon in pass-by manner with non-radially oriented magnetic anisotropy is a SUL comprised of a soft magnetic material selected from the group consisting of Ni, NiFe (Permalloy), Co, CoZr, CoZrCr, CoZrNb, CoFe, Fe, FeN, FeSiAl, FeSiAlN, FeCoC, and FeCoB, and the subsequently deposited component layers of the layer stack constituting the recording medium include a non-magnetic intermediate layer and at least one magnetically hard recording layer, preferably at least one magnetically hard perpendicular recording layer comprised of a material selected from the group consisting of: Co-based alloys including one or more elements selected from the group consisting of Cr, Fe, Ta, Ni, Mo, Pt, V, Nb, Ge, B, and Pd, iron nitrides, iron oxides, and $(CoX/Pd$ or $Pt)_n$ multilayer magnetic superlattice structures, where n is an integer from about 10 to about 25, and X is an element selected from the group consisting of Cr, Ta, B, Mo, Pt, W, and Fe.

A non-limitative example of a process sequence according to the present disclosure comprises the following process steps: a SUL of appropriate thickness is formed on a suitable disk-shaped substrate (e.g., as described supra) by means of a pass-by magnetron sputter deposition process performed in a first process chamber. The disk is then transported to a second process chamber where the as-deposited SUL is pre-heated to a desired temperature (e.g., from about 100 to about 275° C.). After removal of the heat source, the disk is placed between a pair of opposing magnets to create a sufficiently strong, intense, and uniform magnetic field directed outwardly in the plane of the disk from the center (inner diameter) to the outer diameter to create a residual radially directed magnetic anisotropy. The disk is then allowed to cool in the field to impart the new preferred magnetic orientation to the previously unaligned magnetic anisotropy of the SUL. According to a modification of this process, the as-deposited SUL is pre-heated to the desired temperature in a first sub-chamber of the second processing chamber and then moved to a second sub-chamber of the second chamber for application of the re-orienting magnetic field and disk cooling. Cooling of the disk with the radially oriented SUL thereon may involve convection or conduction cooling between a pair of cold plates, or may be accomplished utilizing cooling means integrally formed with the magnet means (see below).

Several illustrative, but non-limitative examples of magnet assemblies for radially orientating the as-deposited magnetic film according to the disclosure are described below with reference to FIGS. 2-6.

Figure 2:
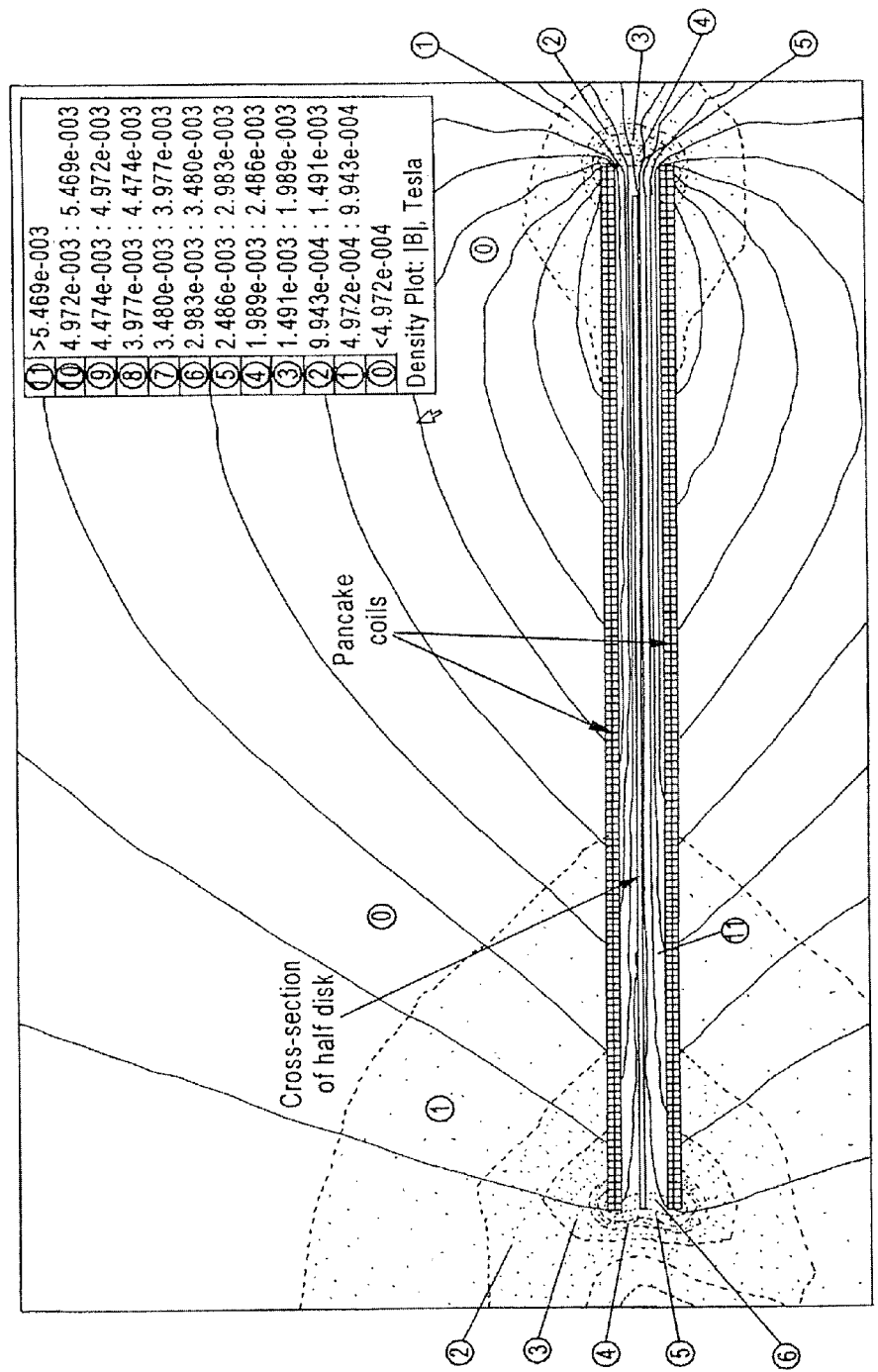
FIG. 2 schematically illustrates, in simplified cross-sectional view, a portion of an embodiment of the present disclosure, wherein the magnetic re-orientation means comprise a plurality of flat, concentric electromagnet coils (in a "pancake" configuration) positioned in spaced adjacency to the opposing major surfaces of a disk-shaped substrate each with a magnetic layer thereon for re-orientation of the as-deposited magnetic anisotropy thereof in a radial direction, as well as the magnetic force lines extending over the magnetic layers.

Referring to FIG. 2, schematically illustrated therein, in simplified cross-sectional view, is a portion of an embodiment of the present disclosure, wherein the magnetic re-orientation means comprises a plurality (e.g., 6) of flat, concentric electromagnet coils arranged in a "pancake" configuration and positioned in spaced adjacency to the opposing major surfaces of the disk-shaped substrate with magnetic layer formed thereon, whereby the magnetic anisotropy of the as-deposited magnetic film is re-oriented in a radial direction. Also shown in the figure is the pattern of magnetic force lines extending over the magnetic layers.

Figure 3:
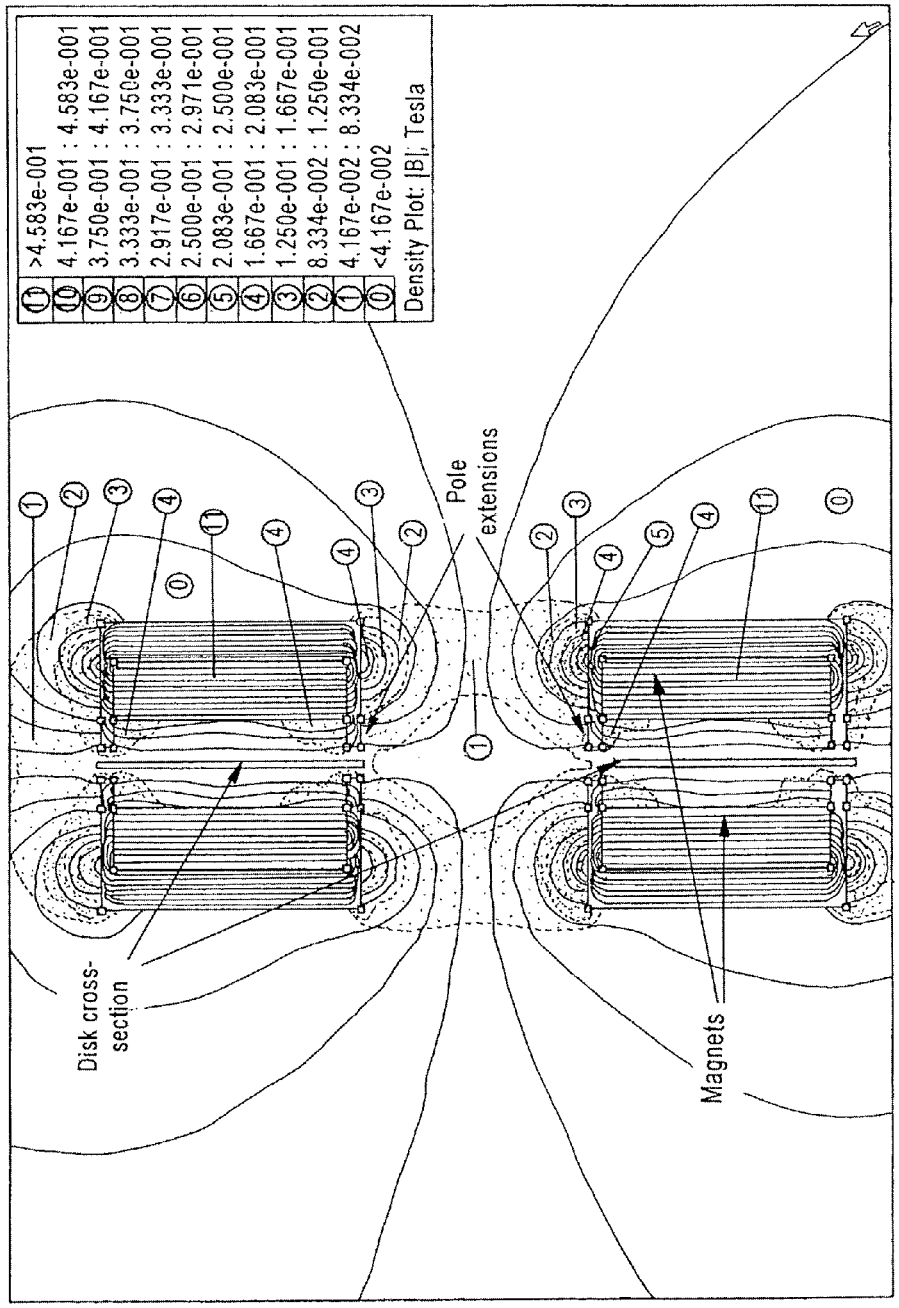
FIG. 3 schematically illustrates, in simplified cross-sectional view, a portion of another embodiment of the present disclosure, wherein the magnetic re-orientation means comprise a plurality of generally flat, trapezoidal-shaped permanent magnets held in a soft magnetic medium with pole extensions for providing a substantially uniform magnetic field across the disk with magnetic layers thereon.
Figure 4:
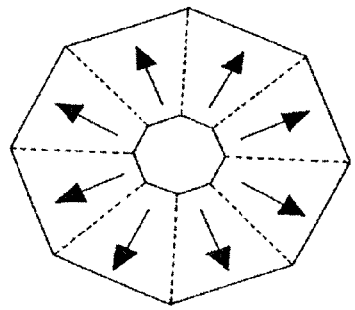
FIG. 4 schematically illustrates, in simplified plan view, the arrangement of the trapezoidal-shaped permanent magnets of the embodiment of FIG. 3, as well as the alignment of the magnetic polarities thereof.

FIG. 3 schematically illustrates, in simplified cross-sectional view, a portion of another embodiment, wherein the magnetic re-orientation means comprises a plurality of generally flat, trapezoidal-shaped permanent magnets held in a soft magnetic medium with pole extensions for providing a substantially uniform magnetic field across the disk with magnetic layers thereon. FIG. 4 schematically illustrates, in simplified plan view, the arrangement of the trapezoidal-shaped permanent magnets of the embodiment of FIG. 3, as well as the directional alignment of the magnetic polarities thereof.

Figure 5:
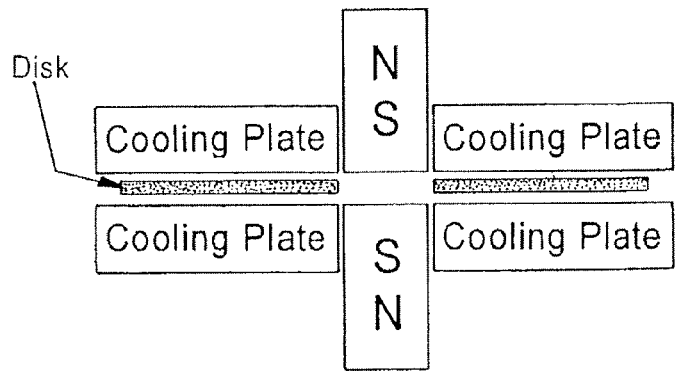
FIGS. 5-7 schematically illustrate, in simplified cross-sectional views, further embodiments of magnetic re-orientation means according to the present disclosure comprising cooling means.
Figure 6:
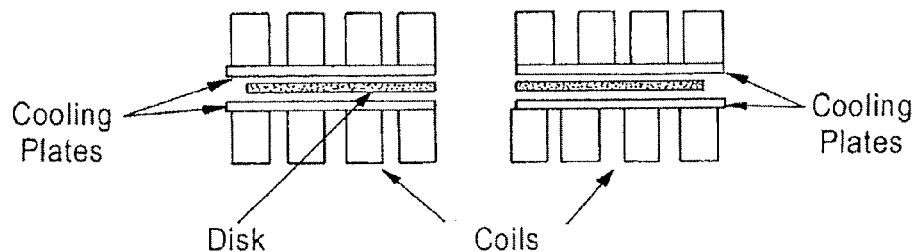
Figure 7:
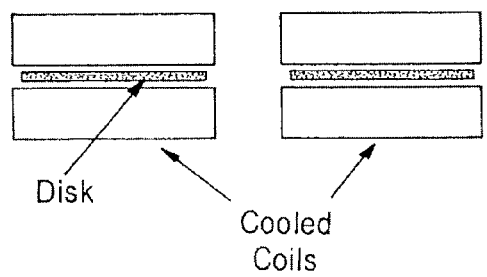

FIGS. 5-7 schematically illustrate, in simplified cross-sectional views, further embodiments showing different configurations of magnetic re-orientation means according to the present disclosure comprising conductive cooling means. More specifically, in the embodiment shown in FIG. 5, the disk is sandwiched between a pair of cooling plates; in FIG. 6, the cooling plates are located adjacent the magnet coils; and in FIG. 7, the magnet coils are integrally provided with channels for flowing coolant therethrough.

Figure 8:
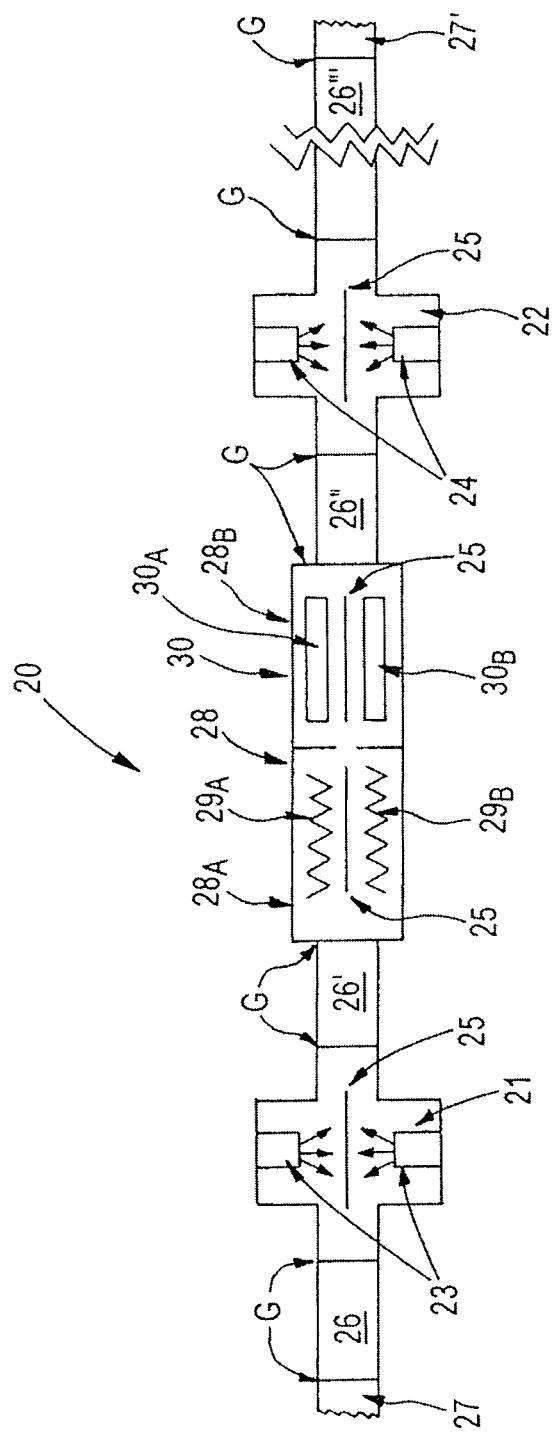
FIG. 8 schematically illustrates, in simplified plan view, an in-line, multi-chamber apparatus according to an embodiment of the disclosure.

Adverting to FIG. 8, schematically illustrated therein, in simplified plan view, is a portion of an in-line apparatus 20 for continuous manufacture of magnetic recording media according to an embodiment of the present disclosure. As illustrated, apparatus 20 comprises a series of linearly arranged process chambers interconnected by respective buffer/isolation chambers 26, etc., each equipped with gate means G. Specifically, apparatus 20 includes respective first and second spaced-apart thin film deposition chambers or stations 21 and 22, illustratively pass-by sputter deposition chambers or stations, each including at least one, preferably a pair of spaced-apart, facing sputter sources 23 or 24 (typically linearly elongated planar magnetron cathodes/targets), for performing pass-by deposition of a selected thin film on at least one surface of substrates 25, preferably simultaneous thin film deposition on both sides of dual-sided, disk-shaped substrates 25. Apparatus 20 further comprises pairs of buffer/isolation chambers, such as 26, 26' and 26", 26"', at opposite laterally spaced ends of respective deposition chambers or stations 21 and 22 for insertion and withdrawal, respectively, of a plurality of substrates 25, e.g., disk-shaped substrates for hard disk recording media carried and transported through each station and from chamber-to-chamber by a corresponding plurality of substrate mounting/transport means (not shown in the figure for illustrative simplicity), e.g., pallet means. In operation of apparatus 20, each of the opposing surfaces of the dual-surfaced substrates 25 faces a respective sputter source 23 or 24 during "pass-by" transport and treatment/processing in the apparatus. Chambers 27, 27' connected to the distal ends of inlet and outlet buffer/isolation chambers 26 and 26"', respectively, are provided for utilizing apparatus 20 as part of a larger, continuously operating, in-line apparatus wherein the substrates 25 receive deposition or other treatment antecedent and/or subsequent to processing in the apparatus portion illustrated in FIG. 8.

According to the disclosure, a third station or chamber 28, comprised, in sequence, of a first sub-chamber $28_A$ located closer to the first sputter deposition chamber 21 and a second sub-chamber $28_B$ located closer to the second sputter deposition chamber 22, is positioned intermediate the first and second spaced-apart sputter deposition chambers or stations 21 and 22 and operatively connected thereto by means of buffer/isolation chambers 26' and 26" (and associated gate means G) at the respective inlet and outlet ends thereof. As illustrated, the first sub-chamber $28_A$ is adapted for heating substrates 25 arriving from the first sputter deposition chamber 21 with a magnetic layer formed thereon and includes at least one heating means 29, illustratively an opposed pair of heating means $29_A$, $29_B$ for heating both sides of the disk-shaped substrates 25. The second sub-chamber $28_B$ is adapted for radially magnetically re-orienting and cooling the magnetic film formed on the substrates in the first sputter deposition chamber and includes at least one magnet means 30, illustratively an opposed pair of magnet means $30_A$, $30_B$ for radially magnetically re-orienting films formed on both sides of substrates 25. Each of the magnet means $30_A$, $30_B$ may be configured as schematically illustrated in the embodiments of FIGS. 2-7, and thus may include separate or integral cooling means, e.g., as in the embodiments shown in FIGS. 6-7.

In operation of apparatus 20, substrates 25, typically dual-sided, annular disk-shaped substrates (such as substrate 3 of FIG. 1, described in detail supra) for hard disk magnetic recording media, enter the illustrated portion of apparatus 20 at inlet chamber 27 after receiving any requisite antecedent processing in a plurality of downstream processing chambers or stations (not shown in the drawing for illustrative simplicity), e.g., for deposition thereon of an adhesion layer not shown in the medium of FIG. 1. Substrates 25 (typically with the adhesion layer formed on both surfaces thereof) are then transported to the first sputter deposition chamber or station 21, wherein a soft magnetic underlayer SUL, i.e., a layer corresponding to layer 4 in FIG. 1, such as, for example, an about 40-400 nm thick SUL comprised of a soft magnetic material such as Ni, NiFe (Permalloy), Co, CoZr, CoZrCr, CoZrNb, CoFe, Fe, FeN, FeSiAl, FeSiAlN, FeCoC, and FeCoB is formed over the adhesion layer by means of pass-by magnetron sputter deposition utilizing sources 23, 24.

Following deposition of a selected SUL 4 of appropriate thickness on the surface(s) of the substrates 25 in the first sputter deposition chamber or station 21, the substrates are transported, via buffer/isolation chamber 26' and associated gates G, to first sub-chamber $28_A$ of the third chamber or station 28 for pre-heating of the as-deposited SUL 4 to a desired temperature, as described supra (e.g., from about 100 to about 275° C.).

The pre-heated substrates 25 are then transported from the first sub-chamber $28_A$ to the second sub-chamber $28_B$ for radially magnetically re-orienting and cooling SUL 4. As indicated supra, for typical hard disk media substrates having inner diameters from about 6 mm to about 25.4 mm and outer diameters from about 21.6 mm to about 95 mm, respectively, with an about 40-400 nm thick pass-by sputter-deposited SUL comprised of a soft magnetic material as described above, the applied tangential magnetic field strength BT ranges from about 200 to about 450 Gauss (as measured at a distance of about 0.4 in. from the disk surface) and the magnetic field is applied for an interval sufficient to effect radial re-orientation of the SUL (e.g., about 1-2 sec. for a SUL comprised of FeCoB).

Upon completion of processing of substrates 25 in sub-chamber $28_B$ for effecting radial re-orientation of SUL 4 and cooling, substrates 25 are transported, via buffer/isolation chamber 26" and associated gates G, to the second sputter deposition chamber or station 22, where a non-magnetic interlayer, corresponding to layer 5 in FIG. 1 is formed, as by pass-by magnetron sputtering, atop the radially oriented SUL 4. As previously described, the relatively thin interlayer 5 may comprise an up to about 30 nm thick layer of a non-magnetic material, such as TiCr.

Following formation of the non-magnetic interlayer 5 on the radially oriented SUL 4 in process/treatment chamber 22, the substrates 25 are serially transported, via respective buffer/isolation chambers 26 and associated gates G, to further process/treatment chambers (not shown in FIG. 8 for illustrative simplicity) for formation thereon of at least one magnetically hard recording layer 6, as by a pass-by magnetron sputtering process, followed by formation thereon of a thin protective overcoat layer 7.

Typically, the at least one magnetically hard recording layer 6 is a perpendicular magnetic layer as described above, e.g., comprised of a material selected from the group consisting of: Co-based alloys including one or more elements selected from the group consisting of Cr, Fe, Ta, Ni, Mo, Pt, V, Nb, Ge, B, and Pd, iron nitrides, iron oxides, and $(CoX/Pd$ or $Pt)_n$ multilayer magnetic superlattice structures, where n is an integer from about 10 to about 25, and X is an element selected from the group consisting of Cr, Ta, B, Mo, Pt, W, and Fe. The protective overcoat layer typically is a carbon (C)-based layer, e.g., diamond-like carbon (DLC), formed by a suitable PVD process, such as sputtering or ion beam deposition (IBD). The thus-processed substrates 25 are then transported, via outlet buffer/isolation chamber 26" and associated gates G, to chamber 27', for withdrawal from apparatus 20. Further processing of the substrates with the media layer stack thereon may include deposition of a lubricant topcoat layer, e.g., a perfluoropolyether compound, by means of dipping or vapor deposition.

In summary, the present disclosure provides means and methodology for continuous, automated fabrication of high areal density, high performance magnetic recording media, particularly perpendicular magnetic recording media requiring radial re-orientation of the magnetic anisotropy of the magnetically soft underlayer (SUL), at enhanced product throughput rates compatible with the requirements for cost-effective manufacture of such media, while maintaining full compatibility with all aspects of automated manufacturing technology. The present invention advantageously eliminates any need for removal of the media precursors from the manufacturing apparatus for effecting the radial re-orientation and re-installation of the oxidized media in the same or a different manufacturing apparatus for subsequent processing/treatment.

In the previous description, numerous specific details are set forth, such as specific materials, structures, processes, etc., in order to provide a better understanding of the present disclosure. However, the present disclosure can be practiced without resorting to the details specifically set forth. In other instances, well-known processing materials and techniques have not been described in detail in order not to unnecessarily obscure the present disclosure.

Only the preferred embodiments of the present disclosure and but a few examples of its versatility are shown and described in the present disclosure. It is to be understood that the present disclosure is capable of use in various other combinations and environments and is susceptible of changes and/or modifications within the scope of the inventive concept as expressed herein.

What is claimed:

1. An apparatus for reorienting the magnetic anisotropy of magnetic recording discs, comprising:
    a pallet that is moveable along a path of travel and that is sized to selectively hold either a first magnetic recording disc of a first size or a second magnetic recording disc of a second size different than the first size;
    a first processing chamber in the path of travel adapted for forming a soft underlayer (SUL) of magnetic material with non-radially oriented magnetic anisotropy on a substrate corresponding to one of the first and second magnetic recording discs; and
    a second processing chamber in the path of travel downstream of the first processing chamber adapted for selectively re-orienting the SUL's magnetic anisotropy via a magnetic source concurrently emanating a magnetic center for each of a plurality of magnetic recording discs held by the pallet and concurrently emanating a radially directed magnetic field from each of the magnetic centers.

2. The apparatus of claim 1 wherein the first magnetic field has a first field strength and the second magnetic field has a different second field strength.

3. The apparatus of claim 2 wherein the magnetic source emanates the first magnetic field strength in a range between about 200 Gauss and about 450 Gauss.

4. The apparatus of claim 1 wherein the second processing chamber comprises a heater.

5. The apparatus of claim 4 wherein the heater is in a sub-chamber to operably preheat the SUL before being subjected to the corresponding magnetic field.

6. The apparatus of claim 4 wherein the second processing chamber comprises a cooler.

7. The apparatus of claim 6 wherein the cooler comprises a cooling plate.

8. The apparatus of claim 6 wherein the cooler comprises a cooling fluid flowing through a channel in the magnetic source.

9. The apparatus of claim 1 wherein the magnetic source comprises a permanent magnet.

10. The apparatus of claim 1 wherein the magnetic source comprises an electromagnet.

11. The apparatus of claim 1 wherein the first magnetic recording disc defines an outer diameter of about 27 millimeters (mm) and the second magnetic recording disc defines an outer diameter of about 95 mm.

12. An apparatus for reorienting the magnetic anisotropy of magnetic recording discs, comprising:
    a pallet that is moveable along a path of travel;
    a first processing chamber in the path of travel adapted for forming soft underlayers (SULs) of magnetic material with non-radially oriented magnetic anisotropy on each of a plurality of substrates corresponding to the magnetic recording discs; and
    a second processing chamber in the path of travel downstream of the first processing chamber adapted for selectively re-orienting each SUL's magnetic anisotropy via a magnetic source concurrently emanating magnetic centers individually for each of a plurality of magnetic recording discs held by the pallet and concurrently emanating magnetic fields radially from each magnetic center.

13. The apparatus of claim 12 wherein the magnetic source has a first field strength for a first size magnetic recording disc and has a different second field strength for a different second size recording disc.

14. The apparatus of claim 12 wherein the second processing chamber comprises a cooler operably coupled in conjunction with the magnetic source.

15. The apparatus of claim 14 wherein the cooler comprises a cooling fluid flowing through a channel formed in the magnetic source.

16. A method for reorienting the magnetic anisotropy of magnetic recording discs, comprising:
    placing a plurality of substrates on a pallet;
    after the placing, moving the pallet through a first processing chamber to form soft underlayers (SULs) of magnetic material with non-radially oriented magnetic anisotropy individually on each substrate of the plurality of substrates; and
    after the moving through the first processing chamber, moving the pallet through a second processing chamber to re-orient each SUL's magnetic anisotropy via a magnetic source concurrently emanating magnetic centers individually for each of the plurality of substrates on the pallet and concurrently emanating magnetic fields radially from each of the magnetic centers.

* * * * *